US011579198B2

(12) United States Patent
Yura

(10) Patent No.: US 11,579,198 B2
(45) Date of Patent: Feb. 14, 2023

(54) INVERTER SYSTEM WITH MOTOR INSULATON INSPECTION FUNCTION

(71) Applicant: OKUMA Corporation, Aichi (JP)

(72) Inventor: Motozumi Yura, Aichi (JP)

(73) Assignee: OKUMA CORPORATION, Aichi (JP)

(*) Notice: Subject to any disclaimer, the term of this patent is extended or adjusted under 35 U.S.C. 154(b) by 0 days.

(21) Appl. No.: 17/517,204

(22) Filed: Nov. 2, 2021

(65) Prior Publication Data
US 2022/0137137 A1    May 5, 2022

(30) Foreign Application Priority Data

Nov. 2, 2020  (JP) .............................. JP2020-183819

(51) Int. Cl.
G01R 31/12     (2020.01)
G01R 31/34     (2020.01)
H02P 27/06     (2006.01)

(52) U.S. Cl.
CPC .............. *G01R 31/34* (2013.01); *H02P 27/06* (2013.01)

(58) Field of Classification Search
CPC .. G01R 31/1227; G01R 27/025; G01R 31/34; H02P 27/06
See application file for complete search history.

(56) References Cited

U.S. PATENT DOCUMENTS

| 2009/0195205 A1* | 8/2009 | Ide ..................... G01R 31/1227 318/490 |
| 2014/0152224 A1 | 6/2014 | Enomoto et al. |
| 2015/0256116 A1 | 9/2015 | Tateda et al. |
| 2016/0377670 A1* | 12/2016 | Tamida .................. G01R 31/34 324/551 |

FOREIGN PATENT DOCUMENTS

| JP | 2009204600 A | 9/2009 |
| JP | 2013018411 A1 | 3/2015 |
| JP | 2015169479 A | 9/2015 |
| JP | 2017103993 A * | 6/2017 ........... G01R 27/025 |

* cited by examiner

*Primary Examiner* — Cortez M Cook
(74) *Attorney, Agent, or Firm* — Cantor Colburn LLP

(57) ABSTRACT

An inverter system includes a converter, an inverter, a first switch SW1 that connects between the converter and an AC power source, a capacitor that smooths a DC power in a DC bus, a resistor Rr connected from a positive voltage side of the DC bus to ground, a second switch SW2 that connects between the resistor Rr and ground, and a controller that controls drive of the inverter system. The controller is configured to: after charging the capacitor, while the first switch SW1 is in an OFF state, turn on the second switch SW2 and obtain a first across voltage $E_{R1}$ of the resistor Rx; turn on an element, among semiconductor elements of the inverter, that is connected to the negative voltage side of the DC bus, and then obtain a second across voltage $E_{R2}$ of the resistor Rx; and inspect insulation resistance of a motor based on the across voltages $E_{R1}$, $E_{R2}$.

3 Claims, 5 Drawing Sheets

INVERTER SYSTEM WITH MOTOR INSULATON INSPECTION FUNCTION

CROSS REFERENCE TO RELATED APPLICATION

The present invention claims priority under 35 U.S.C. § 119 to Japanese Patent Application No. 2020-183819 filed on Nov. 2, 2020, the entire content of which is incorporated herein by reference.

TECHNICAL FIELD

The present specification discloses an inverter system having a function of inspecting insulation resistance of a motor to be driven.

BACKGROUND

In a manufacturing facility, since a sudden failure impairs productivity, it is desirable to detect any failure in advance and carry out preventive maintenance. Specifically in a machine tool for performing metal processing, there frequently occurs a failure in which an aqueous cutting fluid used for the processing forms a mist, adheres to and penetrates into the motor, and causes insulation degradation. Accordingly, it is desirable to check and diagnose motor insulation resistance.

In earlier times, for diagnosing the motor insulation resistance, the motor was disconnected from the inverter during a non-operating period of the machine so as to measure the motor insulation resistance using an insulation resistance tester, and this process was performed periodically. However, in complex machine structures of recent years, performing inspection by disconnecting the motor requires much workload and time, which problematically reduces productivity due to inspection work.

In order to reduce the workload of motor insulation inspection, techniques for measuring the insulation resistance using a function of the inverter have been devised. For example, in Patent Document 1, a voltage divider circuit as shown in FIG. 4, which is configured with resistors R1 and R2 and connected from the negative voltage side of an inverter DC bus, is coupled to ground via switch a SW2, and at that time, by simultaneously turning on the semiconductor elements constituting the inverter, a closed circuit including motor insulation resistance Rx is formed, and a voltage that occurs in the voltage divider circuit is detected. At this point, the inverter circuit is cut off from the AC power source by turning off switch SW1.

In FIG. 4, when the switch SW2 and any one of the semiconductor elements located on the upper side of the inverter are turned on, a current flows through the resistor R1 via the following path: positive voltage side of DC bus→inverter element→motor line→motor insulation resistance Rx→ground→resistor R2→switch SW2→resistor R1→negative voltage side of DC bus. By detecting the voltage that occurs in the resistor R1, it is possible to derive the motor insulation resistance Rx value, which is the target of measurement.

However, in an actual inverter system, because of the presence of leak current from the semiconductor elements constituting the inverter and the converter as well as leak current caused by other constituent components in the inverter system, the motor insulation resistance Rx value cannot be accurately calculated. In particular, measurement accuracy tends to be degraded in a system in which a plurality of inverters are connected to a single DC bus so as to control a plurality of motors. This problem is explained by reference to FIG. 5. Motor A is the measurement target motor, and one of the upper-side semiconductor elements of inverter A is turned on to apply to the motor A the voltage of the positive side of the DC bus. Regarding motor B, although all of the semiconductor elements of inverter B are turned off, leak currents IL1, IL2, IL3 flow through the semiconductor elements, and these currents flow via insulation resistance Rx2 of the motor B to the resistor R1. As a result, the voltage that occurs in the resistor R1 includes an error component due to the insulation resistance Rx2 of the motor B, in addition to reflecting insulation resistance Rx1 of the motor A.

To deal with this problem, for example, in Patent Document 2, by turning on all of the lower-side semiconductor elements of the inverter B and thereby applying the voltage of the negative side of the DC bus to the motor B, the voltage applied to the motor when the switch SW2 is turned on is set to a potential close to ground, so that flow of leak current is prevented.

CITATION LIST

Patent Literature

Patent Document 1: JP 2009-204600 A
Patent Document 2: JP 2015-169479 A
Patent Document 3: WO 2013/018411 A Although the above-mentioned Patent Documents 1 and 2 disclose techniques that attempt to eliminate the influence of insulation resistance of any motor other than the measurement target motor, in an actual inverter system, there are additional factors that degrade the accuracy of the insulation resistance measurement. Those factors are explained by reference to FIG. 3. The inverter system shown in FIG. 3 is configured such that the converter 3 can perform reversible conversion using semiconductor elements such as IGBTs, and serves to recover regenerative electric power from a load motor 7. Power regeneration is indispensable for applications in which accelerating and decelerating operations are very frequently performed, such as machine tool main spindle drive applications, and consequently such an inverter system is commonly used.

In a converter 3 that performs power regeneration, since a current is made to flow in the AC power source line by switching control, a line filter 2 is generally inserted between the converter 3 and the AC power source 1 for smoothing the current. As shown in FIG. 3, this line filter 2 is often configured with reactors and capacitors, and as the capacitors, discharge resistors on the order of several hundred kΩ are often connected in parallel.

When the insulation resistance measurement methods as disclosed in Patent Documents 1 and 2 are applied to an inverter system as shown in FIG. 3, not only is the measurement target motor insulation resistance reflected but also leak current from the semiconductor elements of the converter 3 is included in the current that flows to the detection resistor Rr via the discharge resistors located within the line filter 2, and therefore an error occurs in the detected voltage. Further, while the line filter 2 may be configured without using discharge resistors, in that case, leak current is caused to flow due to the voltage accumulated in the capacitors, which serves as an error factor. In addition, insulation resistance RF of the reactors of the line filter 2 is present as another error factor. As such, there is the problem that the motor insulation resistance cannot be measured accurately due to these multiple error factors.

Further, Patent Document 3 discloses that the motor insulation resistance cannot be measured accurately when there is leak current from the semiconductor elements constituting the inverter or leak current from the DC bus circuit of the inverter. As a measure for addressing this problem, in measuring the insulation resistance, Patent Document 3 discloses first making a measurement while the semiconductor elements of the inverter are in an OFF state, and when insulation resistance of a predetermined value or higher is detected at that point, discontinuing the process of measuring the motor insulation resistance. In other words, there is the problem that the motor insulation resistance cannot be measured when the above-described error factors are present.

SUMMARY

An inverter system with motor insulation inspection function as disclosed in the present specification includes: a converter that converts an AC power supplied from an AC power source into a DC power and outputs the DC power to a DC bus; a first switch that switches on and off a connection between the converter and the AC power source; an inverter which includes a plurality of semiconductor elements, and which converts the DC power charged on the DC bus into an AC power and applies the AC power to a motor; a capacitor that smooths the DC power in the DC bus; a resistor connected from one of a positive voltage side or a negative voltage side of the DC bus to ground; a second switch that switches on and off a connection path between the resistor and the ground; a first voltage detection circuit that detects an across voltage across the resistor; and a controller that controls drive of the inverter system. The controller is configured to perform: a charge processing including turning on the first switch and charging the capacitor; a first detection processing including, after the charge processing, while all of the inverter, the converter, and the first switch are in an OFF state, turning on the second switch and then obtaining an output from the first voltage detection circuit as a first across voltage; a second detection processing including, after the charge processing, while both of the converter and the first switch are in an OFF state, turning on the second switch, also turning on any element, among the semiconductor elements of the inverter, that is connected to the other one of the positive voltage side or the negative voltage side of the DC bus, and then obtaining an output from the first voltage detection circuit as a second across voltage; and an inspection processing including, after the first detection processing and the second detection processing, inspecting a quality of insulation resistance of the motor based on at least the first across voltage and the second across voltage.

In the above configuration, the inverter system may further include a second voltage detection circuit that detects a voltage of the DC bus. The controller may: additionally obtain, in the first detection processing, an output from the second voltage detection circuit as a first DC bus voltage; additionally obtain, in the second detection processing, an output from the second voltage detection circuit as a second DC bus voltage; and calculate, in the inspection processing, the insulation resistance of the motor based on the first DC bus voltage, the second DC bus voltage, the first across voltage, the second across voltage, and a resistance value of the resistor.

In the above configuration, the controller may calculate the insulation resistance Rx of the motor according to the following Equation 1, where EDC1 denotes the first DC bus voltage, EDC2 denotes the second DC bus voltage, ER1 denotes the first across voltage, ER2 denotes the second across voltage, and Rr denotes the resistance value of the resistor.

$$R_x = R_r \left( \frac{E_{DC1} E_{DC2}}{E_{R2} E_{DC1} - E_{R1} E_{DC2}} - 1 \right) \qquad \text{Equation 1}$$

According to an inverter system with motor insulation inspection function as disclosed in the present specification, the insulation resistance of the measurement target motor can be measured accurately by eliminating the influences of error factors such as discharge resistance included in the line filter, insulation resistance of any motor other than the measurement target, and insulation resistance of the reactors of the line filter. As a result, it is possible to eliminate the need for the maintenance work of periodically disconnecting the motor and inspecting its insulation resistance for preventive maintenance.

BRIEF DESCRIPTION OF DRAWINGS

Embodiment(s) of the present disclosure will be described based on the following figures, wherein.

DESCRIPTION OF EMBODIMENTS

Figure 1:
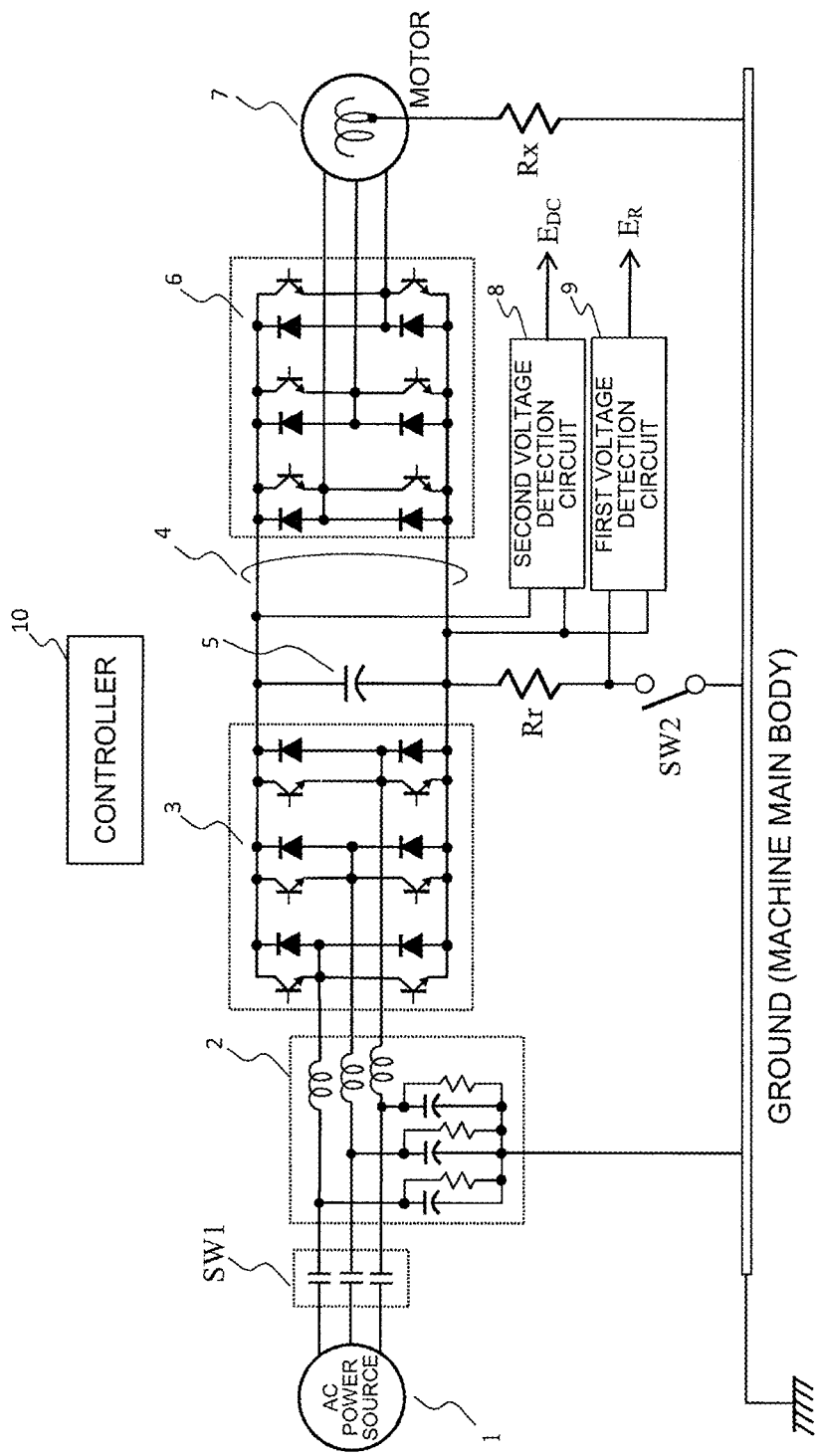
FIG. 1 is a configuration diagram of an inverter system.

FIG. 1 is a configuration diagram of an inverter system. An AC power source 1 is connected to a line filter 2 via a first switch SW1. A three-phase AC power that passed through the line filter 2 is input into a converter 3 so as to be converted into a DC power, which is output to a DC bus 4. A capacitor 5 for smoothing the DC power is connected to the DC bus 4.

The DC bus 4 is connected to a DC input terminal of an inverter 6. The inverter 6 converts the DC power into an AC power by performing switching control of semiconductor elements, and applies the AC power to a motor 7.

The motor 7 has a structure in which coils are contained inside a metallic (i.e., conductive) chassis, and insulation between the chassis and the coils is provided by an insulation material. However, when moisture penetrates into the chassis as a result of long-term use, insulation resistance is reduced, and leak current flows between the coils and the chassis. In FIG. 1, this insulation resistance is denoted by Rx. Since the chassis is fixed to the machine main body, the leak current flowing through the insulation resistance Rx accordingly flows out to the machine main body. A controller 10 carries out switching on and off of the first switch SW1 and a second switch SW2, and semiconductor elements constituting the converter 3 and the inverter 6. The controller 10 also performs step 0 to step 4 explained further below and thereby inspects the insulation resistance Rx of the motor 7 based on detected values of a first voltage detection circuit 9 and a second voltage detection circuit 8 described below. The controller 10 is configured with, for example, a computer comprising a processor and a memory.

In the inverter system as described above, in order to measure the insulation resistance Rx of the motor 7, a resistor Rr is connected from the negative voltage side of the DC bus 4 and coupled to ground; i.e., the machine main body, via the second switch SW2. While the resistor Rr is connected to the negative voltage side of the DC bus 4 in the present example, the resistor Rr may alternatively be connected to the positive voltage side. In a case where the connection is made to the positive voltage side, an equivalent function can be realized by exchanging the positive voltage side (or the upper side) and the negative voltage side (or the lower side) with each other in the operations of the semiconductor elements described below. In the inverter system, there are provided the first voltage detection circuit 9 that detects an across voltage across the resistor Rr, and the second voltage detection circuit 8 that detects a DC voltage of the DC bus 4.

Figure 2:
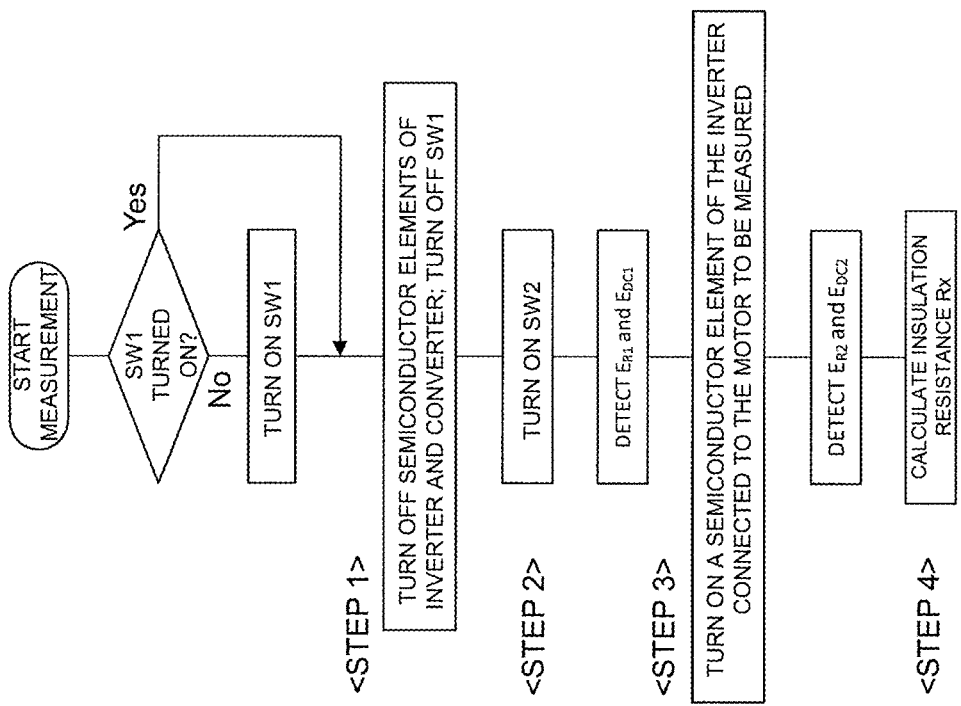
FIG. 2 is a flowchart illustrating an operation for measuring motor insulation resistance.

An operation sequence for inspecting the insulation resistance Rx will now be described by reference to the flowchart of FIG. 2.

<Step 0>

In a measurement process, first, the state of the switch SW1 is checked. In a case where the first switch SW1 is already turned on due to reasons such as that the motor 7 was in operation before the start of the measurement process, the capacitor 5 is in a state charged with DC voltage. In that case, the process simply proceeds to step 1. On the other hand, in a case where, at the start of the measurement process, the first switch SW1 is in an OFF state and the capacitor 5 is not charged, the first switch SW1 is temporarily turned on so as to charge the capacitor 5.

<Step 1>

When the capacitor 5 is charged, an OFF signal is then supplied to the semiconductor elements of the inverter 6 and the converter 3, and also the first switch SW1 is turned off. At that time, the capacitor 5 remains in a state charged with DC voltage, and this DC voltage is to be used for performing the measurement operation.

<Step 2>

Figure 3:
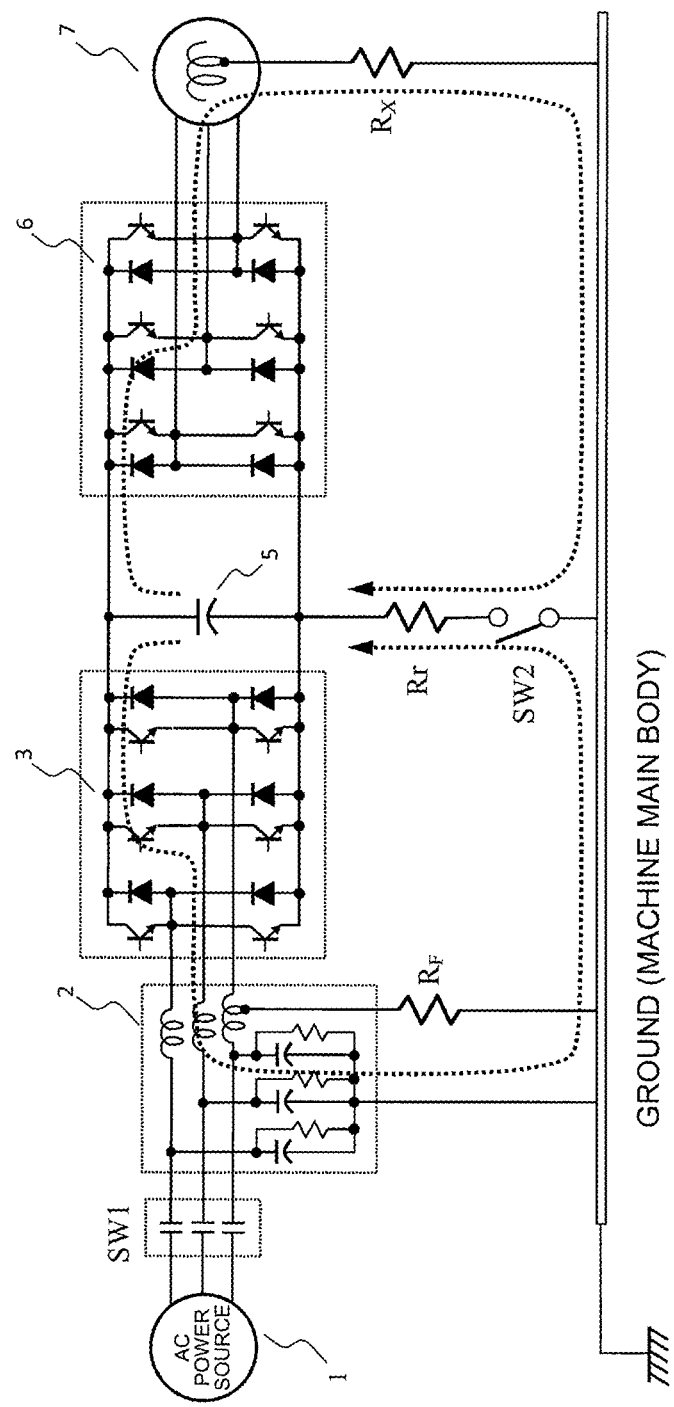
FIG. 3 is a diagram explaining problems in insulation resistance measurement in an inverter system.
Figure 4:
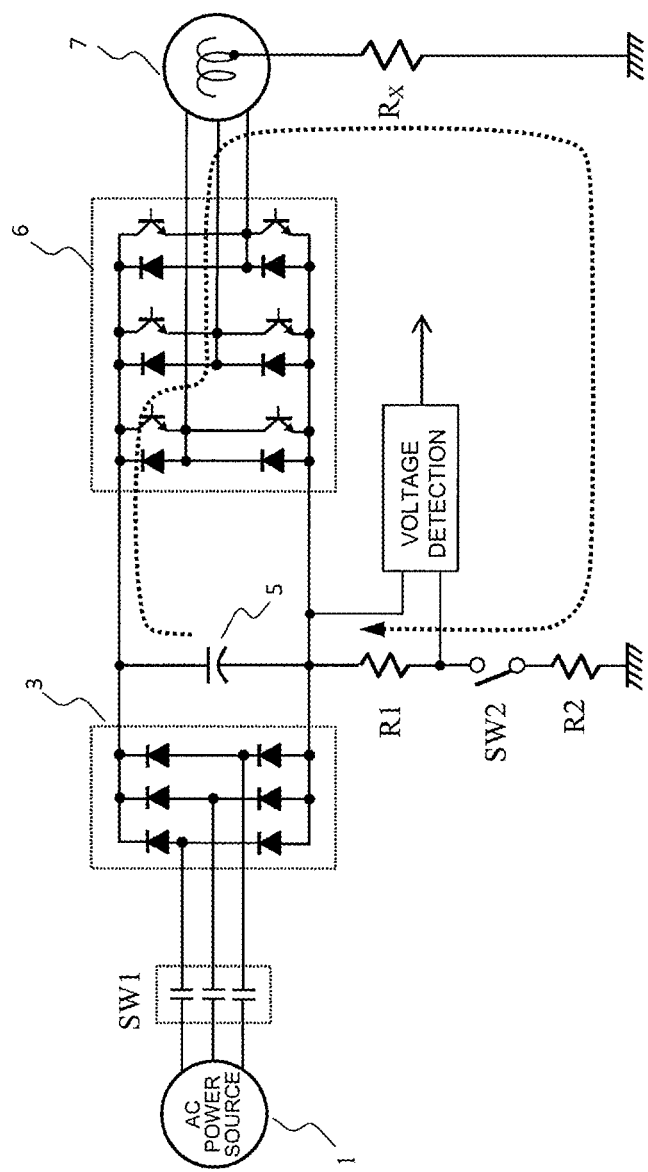
FIG. 4 is a configuration diagram of an inverter system according to background art.

Next, the second switch SW2 is turned on. At that time, the inverter 6 and the converter 3 are in an OFF state, and due to leak current from the semiconductor elements, current as indicated by dashed lines in FIG. 3 flows through the resistor Rr. At this point, a DC voltage of the DC bus 4 is detected as a first DC bus voltage EDC1 by the second voltage detection circuit 8, and an across voltage across the resistor Rr is detected as a first across voltage ER1 by the first voltage detection circuit 9.

<Step 3>

Next, an ON signal is supplied to any of the upper-side semiconductor elements of the inverter 6 that drives the motor 7 serving as the measurement target. In the motor, since the coils are generally connected to each other on the inside, it is sufficient to simply turn on any one of the three phases. Subsequently, an across voltage across the resistor Rr is detected as a second across voltage ER2, and a DC bus voltage is detected as a second DC bus voltage EDC2.

At that time, since the DC voltage of the DC bus 4 is applied to the motor 7, any current that flows through the insulation resistance Rx flows to the resistor Rr. In a case where the insulation resistance Rx is sufficiently high and no current flows therethrough, the second across voltage ER2 becomes equal to the first across voltage ER1 detected in the above step 2. On the other hand, in a case where Rx is decreased, the current increases such that ER1<ER2 holds true, and the current that flows through Rx is detected as the increase in current.

The second DC bus voltage EDC2 detected in step 3 is basically equal to the first DC bus voltage EDC1. However, when it takes a relatively long time to proceed from step 2 to step 3, the DC voltage of the capacitor 5 decreases due to discharging, so that EDC1>EDC2 holds true.

Here, the time difference between step 2 and step 3 is explained as follows. As noted above, the first across voltage ER1 detected in step 2 is caused by leak current from the semiconductor elements. As is commonly known, leak current from a semiconductor element changes depending on the element temperature. Accordingly, by executing step 2 immediately before step 3, the first across voltage ER1 and the second across voltage ER2 can be detected in substantially the same temperature environment, and therefore a highly accurate insulation resistance measurement can be conducted.

<Step 4>

The values of ER1, ER2, EDC1, and EDC2 obtained in the above steps are used to calculate the motor insulation resistance Rx according to the following equation.

$$R_x = R_r \left( \frac{E_{DC1} E_{DC2}}{E_{R2} E_{DC1} - E_{R1} E_{DC2}} - 1 \right)$$ Equation 1

Although the above description illustrated an example in which, in step 2, a measurement is conducted while all of the semiconductor elements are in an OFF state, it is alternatively possible to supply an ON signal to the semiconductor elements located on the DC bus negative voltage side. In that case, leak current from the semiconductor elements can be reduced, and therefore the measurement accuracy of the insulation resistance Rx can be further enhanced. Further, step 2 and step 3 may be executed by exchanging their positions in the order of sequence. In other words, in a case where step 3 is to be executed before step 2, ER2 and EDC2 are detected first, ER1 and EDC1 are detected subsequently, but the insulation resistance Rx can be calculated in the same manner according to the above equation.

Figure 5:
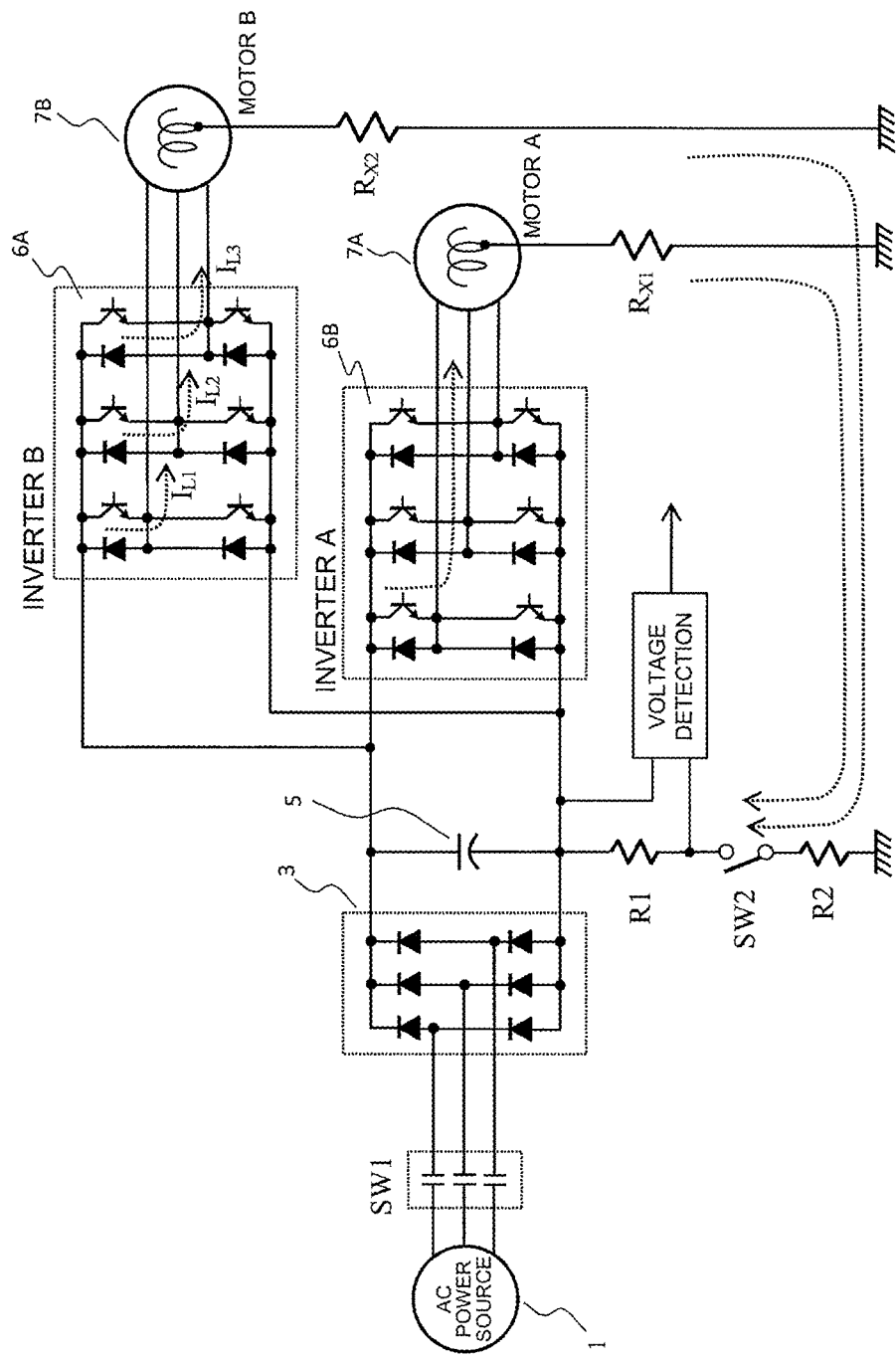
FIG. 5 is a configuration diagram of another inverter system according to background art.

Although the above description referred to an example including one each of an inverter and a motor, the present disclosure can similarly be implemented in an inverter system that drives two or more motors as shown in FIG. 5. In that case, after executing step 2 once, step 3 and step 4 are repeatedly executed a number of times corresponding to the number of motors, to thereby calculate the insulation resistance Rx values of the respective motors. When the number of motors is large, the DC voltage of the DC bus 4 gradually decreases during the time in which step 3 and step 4 are repeatedly executed, which causes degradation in measurement accuracy. Such degradation in measurement accuracy can be prevented by, for example, adding an operation of executing step 2 once every time a measurement for one motor is conducted.

Further, when it is desired to simplify the processing of calculating the insulation resistance Rx, only ER1 and ER2 obtained in step 2 and step 3 may be used to determine an approximate value of the insulation resistance Rx based on a difference between these values (i.e., ER2−ER1). That is, since the difference (ER2−ER1) increases when the insulation resistance Rx degrades, the difference (ER2−ER1) may be compared to a prescribed threshold value, and when the difference exceeds the threshold value, the insulation resistance Rx may be determined inadequate. When using this processing, step 2 and step 3 must be executed successively in a short time. Since any change in the DC bus voltage is sufficiently small during that time, EDC1≈EDC2 can be assumed to hold true.

REFERENCE SIGNS LIST

1 AC power source, 2 line filter, 3 converter, 4 DC bus, 5 capacitor, 6 inverter, 7 motor, 8 second voltage detection circuit, 9 first voltage detection circuit, 10 controller.

The invention claimed is:
1. An inverter system with motor insulation inspection function, comprising:
   a converter that converts an AC power supplied from an AC power source into a DC power and outputs the DC power to a DC bus;
   a first switch that switches on and off a connection between the converter and the AC power source;
   an inverter which includes a plurality of semiconductor elements, and which converts the DC power charged on the DC bus into an AC power and applies the AC power to a motor;
   a capacitor that smooths the DC power in the DC bus;
   a resistor connected from one of a positive voltage side or a negative voltage side of the DC bus to ground;
   a second switch that switches on and off a connection path between the resistor and the ground;
   a first voltage detection circuit that detects an across voltage across the resistor; and
   a controller that controls drive of the inverter system, wherein
   the controller is configured to perform:
      a charge processing comprising turning on the first switch and charging the capacitor;
      a first detection processing comprising, after the charge processing, while all of the inverter, the converter, and the first switch are in an OFF state, turning on the second switch and then obtaining an output from the first voltage detection circuit as a first across voltage;
      a second detection processing comprising, after the charge processing, while both of the converter and the first switch are in an OFF state, turning on the second switch, also turning on any element, among the semiconductor elements of the inverter, that is connected to the other one of the positive voltage side or the negative voltage side of the DC bus, and then obtaining an output from the first voltage detection circuit as a second across voltage;
      an inspection processing comprising, after the first detection processing and the second detection processing, inspecting a quality of insulation resistance of the motor based on at least the first across voltage and the second across voltage.

2. The inverter system with motor insulation inspection function according to claim 1, further comprising
   a second voltage detection circuit that detects a voltage of the DC bus,
   the controller is configured to:
      additionally obtain, in the first detection processing, an output from the second voltage detection circuit as a first DC bus voltage;
      additionally obtain, in the second detection processing, an output from the second voltage detection circuit as a second DC bus voltage; and
      calculate, in the inspection processing, the insulation resistance of the motor based on the first DC bus voltage, the second DC bus voltage, the first across voltage, the second across voltage, and a resistance value of the resistor.

3. The inverter system with motor insulation inspection function according to claim 2, wherein
   the controller calculates the insulation resistance Rx of the motor according to the following Equation 1

$$R_x = R_r \left( \frac{E_{DC1} E_{DC2}}{E_{R2} E_{DC1} - E_{R1} E_{DC2}} - 1 \right) \qquad \text{Equation 1}$$

where $E_{DC1}$ denotes the first DC bus voltage, $E_{DC2}$ denotes the second DC bus voltage, $E_{R1}$ denotes the first across voltage, $E_{R2}$ denotes the second across voltage, and Rr denotes the resistance value of the resistor.

* * * * *